United States Patent
Zhou et al.

(10) Patent No.: US 9,583,620 B2
(45) Date of Patent: Feb. 28, 2017

(54) SHAPED CAVITY FOR SIGE FILLING MATERIAL

(71) Applicant: Shanghai Huali Microelectronics Corporation, Shanghai (CN)

(72) Inventors: Haifeng Zhou, Shanghai (CN); Jun Tan, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 14/706,986

(22) Filed: May 8, 2015

(65) Prior Publication Data

US 2016/0308050 A1    Oct. 20, 2016

(30) Foreign Application Priority Data

Apr. 14, 2015  (CN) .......................... 2015 1 0175220

(51) Int. Cl.
| | |
|---|---|
| H01L 31/0328 | (2006.01) |
| H01L 31/0336 | (2006.01) |
| H01L 31/072 | (2012.01) |
| H01L 31/109 | (2006.01) |
| H01L 31/0256 | (2006.01) |
| H01L 29/78 | (2006.01) |
| H01L 29/161 | (2006.01) |
| H01L 29/165 | (2006.01) |
| H01L 29/08 | (2006.01) |
| H01L 29/66 | (2006.01) |
| H01L 21/02 | (2006.01) |
| H01L 21/306 | (2006.01) |

(52) U.S. Cl.
CPC .... *H01L 29/7848* (2013.01); *H01L 21/02532* (2013.01); *H01L 21/30604* (2013.01); *H01L 29/0847* (2013.01); *H01L 29/161* (2013.01); *H01L 29/165* (2013.01); *H01L 29/6656* (2013.01); *H01L 29/66636* (2013.01)

(58) Field of Classification Search
CPC .. H01L 29/7848; H01L 29/161; H01L 29/165
USPC ................................................... 257/192, 76
See application file for complete search history.

(56) References Cited

U.S. PATENT DOCUMENTS

| | | |
|---|---|---|
| 6,906,400 B2 | 6/2005 | Delhougne et al. |
| 6,946,350 B2 | 9/2005 | Lindert et al. |
| 6,949,482 B2 | 9/2005 | Murthy et al. |
| 7,494,884 B2 | 2/2009 | Lin et al. |
| 7,553,717 B2 | 6/2009 | Chakravarthi et al. |
| 7,615,390 B2 | 11/2009 | Meunier-Beillard et al. |
| 7,989,298 B1 | 8/2011 | Chan et al. |
| 8,017,487 B2 | 9/2011 | Chong et al. |
| 8,183,118 B2 | 5/2012 | Lu et al. |
| 8,674,447 B2 | 3/2014 | Adam et al. |

(Continued)

FOREIGN PATENT DOCUMENTS

EP    1801864 B1    11/2009

*Primary Examiner* — David S Blum
(74) *Attorney, Agent, or Firm* — Kilpatrick Townsend & Stockton LLP

(57) ABSTRACT

The present invention is directed to semiconductor processes and devices. More specifically, embodiments of the present invention provide a semiconductor device that comprises a diamond-shaped cavity, and the shaped cavity is filled with silicon and germanium material. There are other embodiments as well.

5 Claims, 5 Drawing Sheets

(56) References Cited

U.S. PATENT DOCUMENTS

| | | |
|---|---|---|
| 2005/0148147 A1 | 7/2005 | Keating et al. |
| 2006/0138398 A1 | 6/2006 | Shimamune |
| 2008/0290370 A1 | 11/2008 | Han |
| 2012/0319120 A1* | 12/2012 | He .................... H01L 29/66545 257/66 |
| 2012/0319168 A1* | 12/2012 | Liu ................... H01L 21/02381 257/192 |
| 2012/0326268 A1 | 12/2012 | Kato et al. |
| 2014/0322879 A1* | 10/2014 | Li ..................... H01L 21/30608 438/285 |
| 2014/0357056 A1* | 12/2014 | Li ....................... H01L 21/3065 438/478 |
| 2015/0236157 A1* | 8/2015 | Kwok ................. H01L 29/7848 257/192 |
| 2015/0236158 A1* | 8/2015 | Chang .............. H01L 21/02579 257/190 |
| 2016/0020275 A1* | 1/2016 | Tsai ................... H01L 29/7846 257/192 |
| 2016/0071980 A1* | 3/2016 | Chang ................ H01L 21/0223 257/410 |
| 2016/0240672 A1* | 8/2016 | Li ....................... H01L 29/7848 |

* cited by examiner

SHAPED CAVITY FOR SIGE FILLING MATERIAL

CROSS-REFERENCES TO RELATED APPLICATIONS

The present application claims priority to Chinese Patent Application No. 201510175220.2, filed on Apr. 14, 2015, entitled "SHAPED CAVITY FOR SIGE FILLING MATERIAL", which is incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to semiconductor processes and devices.

Since the early days when Dr. Jack Kilby at Texas Instruments invented the integrated circuit, scientists and engineers have made numerous inventions and improvements on semiconductor devices and processes. The last five decades or so have seen a significant reduction in semiconductor sizes, which translates to ever increasing processing speed and decreasing power consumption. Furthermore, so far, the development of semiconductors has generally followed Moore's Law, which roughly states that the number of transistors in a dense integrated circuit doubles approximately every two years. Now, semiconductor processes are pushing toward below 20 nm, a situation in which some companies are now working on 14 nm processes. Just to provide a reference, a silicon atom is about 0.2 nm, which means the distance between two discrete components manufactured by a 20 nm process is just about a hundred silicon atoms.

Manufacturing semiconductor devices has thus become more and more challenging and is pushing toward the boundary of what is physically possible. Huali Microelectronic Corporation™ is one of the leading semiconductor fabrication companies that has focused on the research and development of semiconductor devices and processes.

One of the recent developments in semiconductor technologies has been utilization of silicon germanium (SiGe) in semiconductor manufacturing. For example, SiGe can be used for manufacturing of complementary metal-oxide-semiconductor (CMOS) with adjustable band gap. While conventional techniques exist for SiGe-based processes, these techniques are unfortunately inadequate for the reasons provided below. Therefore, improved methods and systems are desired.

DETAILED DESCRIPTION OF THE INVENTION

Figure 1:
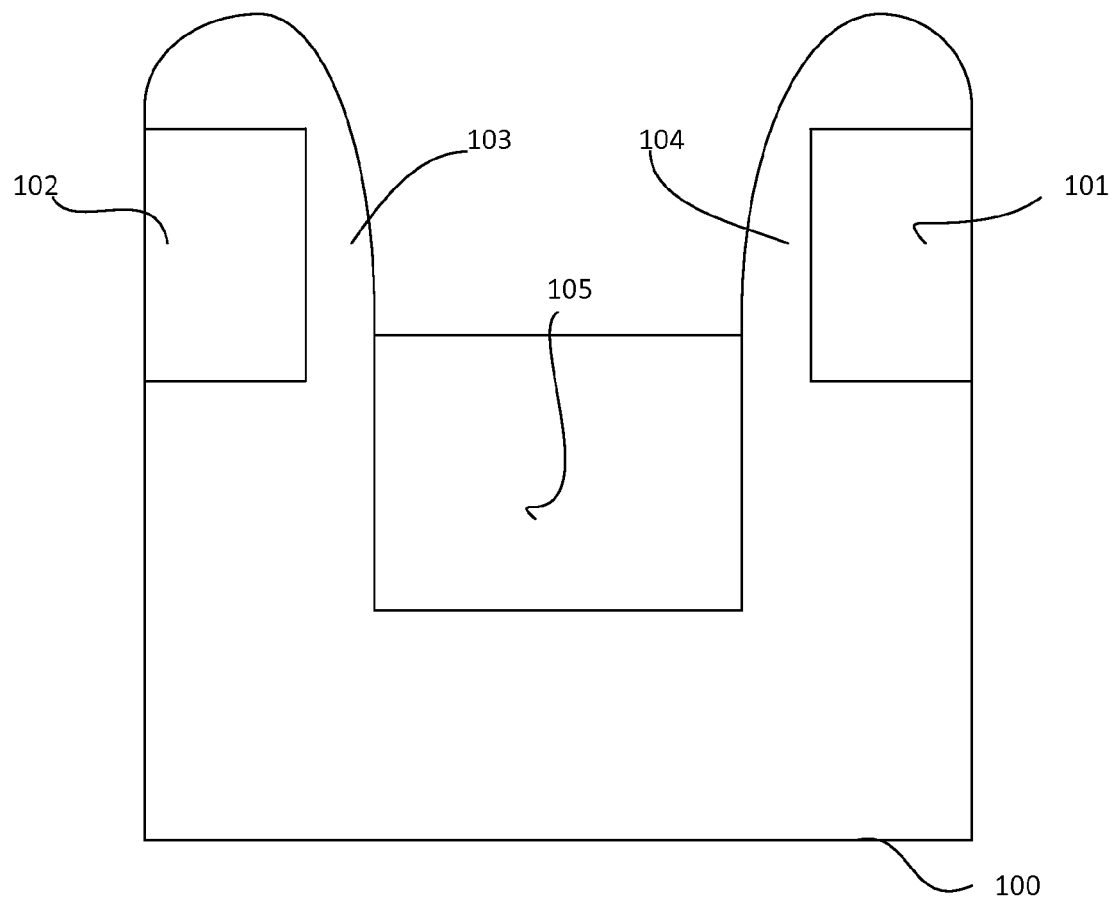
FIG. 1 is a simplified diagram illustrating a conventional U-shaped cavity for SiGe material.

The present invention is directed to semiconductor processes and devices. More specifically, embodiments of the present invention provide a semiconductor device that comprises a diamond-shaped cavity, and the shaped cavity is filled with silicon and germanium material. There are other embodiments as well.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

As mentioned above, there are many challenges as semiconductor processes scale down. Downscaling IC provides many advantages, including reduction in power consumption and increase in computation speed, as electrons travel less distance from one IC component to another. For example, for CMOS devices, as the sizes of various critical dimensions (e.g., size of gate oxide) decrease, the carrier mobility drops quickly, which adversely affects device performance. SiGe technology, when utilized in various applications, can improve device performance by improving carrier mobility.

For certain types of devices and manufacturing processes thereof, SiGe technology can significantly improve device performance. For example, Intel™ explored the usage of SiGe when using 90 nm process to improve the performance of logic units. As the manufacturing processes moved to 45 nm, 32 nm, and 22 nm, the amount of germanium content increased. In the early SiGe devices, germanium makes up less than 15% of the device. As device size decreases, the amount of germanium increases to 40% or even higher. For example, in a CMOS device, SiGe material is embedded in the source and drain regions. In the past, to increase the amount of embedding of SiGe material, U-shaped and Σ-shaped cavities (or sometimes referred to as recesses) have been proposed for embedding the SiGe materials.

As an example, SiGe technology refers to semiconductor devices and processes that utilize SiGe material to improve device performance. For example, SiGe can be used in a heterojunction bipolar transistor (HBT) that offers advantages over both conventional silicon bipolar and silicon CMOS for implementation of communications circuits. Among other features, the use of SiGe material in these devices improves device performance. However, SiGe devices and processes have their challenges. Among other things, there are difficulties in growing lattice-matched SiGe alloy on Si. Uniformly growing SiGe at the Si-STI interface is desirable, as it increases the performance of the CMOS device. For example, SiGe processes for manufacturing CMOS and other types of devices may comprise various detention of logic gate patterning, such as 45/40 nm, 32/28 nm, and <22 nm, and it is important to maintain logic gate patterns and geometries.

FIG. 1 is a simplified diagram illustrating a conventional U-shaped cavity for SiGe material. A semiconductor substrate 100 comprises a U-shaped cavity for accommodating the filling material 105. For example, the substrate 100 comprises substantially single silicon material. The filling material 105 comprises silicon germanium material. As explained above, with germanium material added to silicon material, carrier mobility and other electrical performance characteristics are improved. For example, the filling material 105 is later used for forming a CMOS device. The semiconductor substrate 100 additionally includes gate materials 101 and 102. For example, the gate materials include metal gate material and/or polysilicon gate material. The gate materials 101 and 102 are protected, respectively, by spacers 103 and 104.

As explained above, an important aspect of the SiGe filling material is its size or volume. Large filling material typically translates to better performance, and it is to be appreciated that embodiments of the present invention increase the cavity size of the substrate, thereby significantly increasing the volume of the SiGe filling material.

Figure 2:
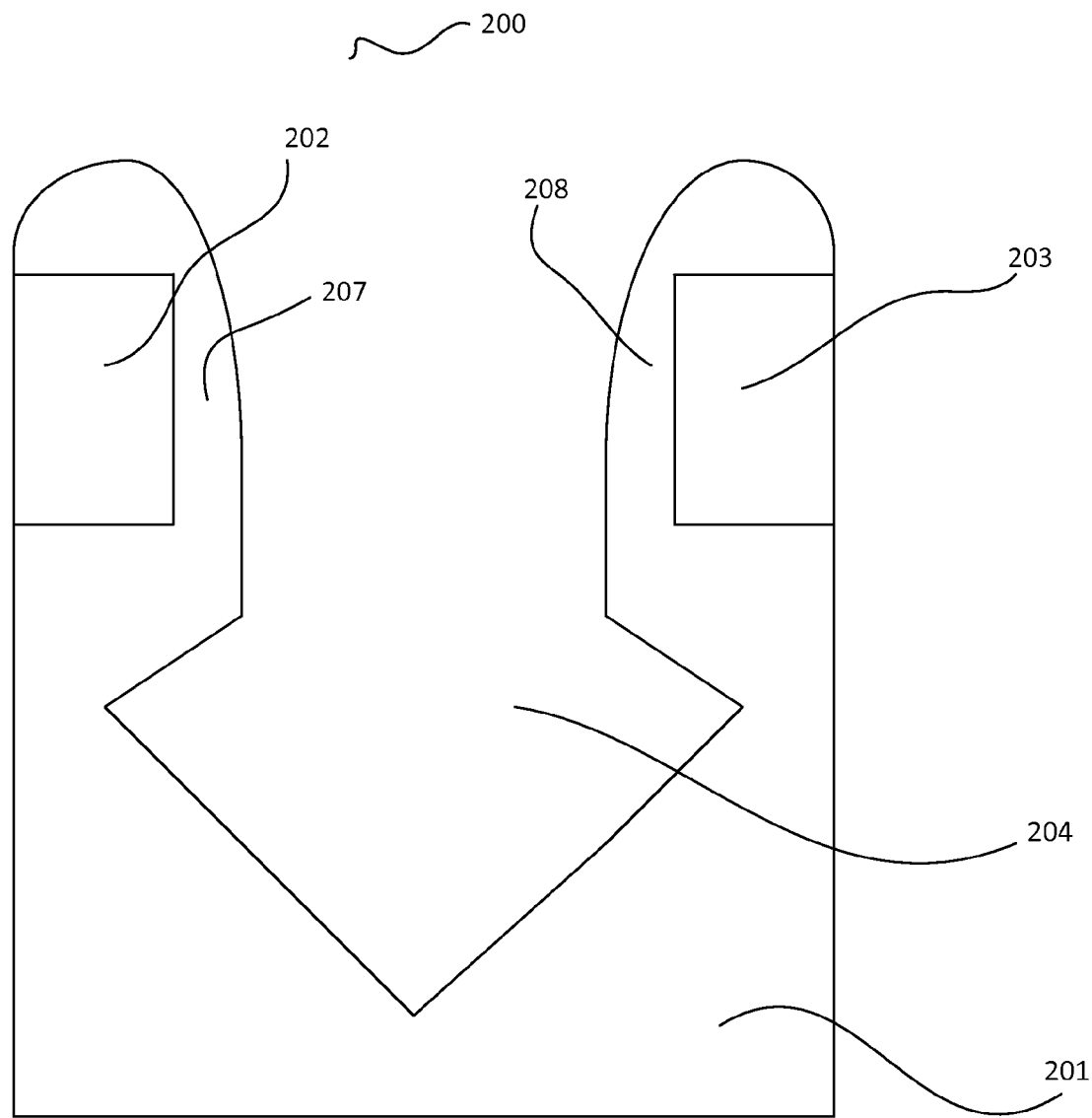
FIG. 2 is a simplified diagram illustrating a cavity structure according to an embodiment of the present invention.

FIG. 2 is a simplified diagram illustrating a cavity structure according to an embodiment of the present invention. This diagram is merely an example, which should not unduly limit the scope of the claims. One of ordinary skill in the art would recognize many variations, alternatives, and modifications. The semiconductor device 200 comprises a substrate 201. For example, the substrate 201 consists essentially of silicon material. For example, the substrate is a part of a silicon wafer. The semiconductor device 200 also includes embedded regions 202 and 203. In certain implementations, regions 202 and 203 comprise polysilicon material. For example, regions 202 and 203 are later processed to form gate regions. In some embodiments, regions 202 and 203 include metal material for forming gate regions. Regions 202 and 203 are protected by spacer 207 and 208. According to various embodiments, spacers 207 and 208 include silicon nitride material. Among other things, the spacers 207 and 208 ensure the opening size of the cavity 204 for embedding the SiGe filling material 204. For example, the opening size can be up to about 100 nm or greater in some implementations. Depending on the device dimensions, other opening sizes are possible as well. For example, in 20/22 nm (or smaller) processes, the opening sizes might be smaller. Ensuring the opening size of the cavity, among other benefits, makes filling the cavity with the filling material an easy and consistent process. Without the spacers, the opening of the cavity may deform into other shapes (e.g., rounded corners or edges due to etching).

As illustrated in FIG. 1, the cavity for embedding SiGe material is U-shaped in various conventional techniques. It is to be appreciated that the shape of the cavity 204 is in a substantially "diamond" shape. For example, the cavity 204 is characterized by an angle of about 54.74 degrees. For example, the angle is relative to a vertical direction.

It is to be appreciated that the SiGe material can be deposited into the cavity 204 in various ways, and thus may have a different composition. For example, the SiGe material may include 10% to 50% germanium content. In addition, concentration of the germanium material varies within the cavity region.

Compared to the Σ-shaped cavity, the shape of cavity 204 provides an increase in volume of about 10% or more. The cavity 204 is later filled with SiGe material. Compared to devices with Σ-shaped cavities, a PMOS device with SiGe material filled into the cavity 204 can provide an improvement in PMOS performance of 3% and even greater. In addition to improvements in performance, the cavity shape, according to embodiments of the present invention, can also provide better yield compared to conventional cavity shapes. With a relatively large opening size, the amount of SiGe material filled into the cavity can be effectively controlled. There are other benefits of the cavity shape illustrated in FIG. 2 according to embodiments of the present invention.

Figure 3:
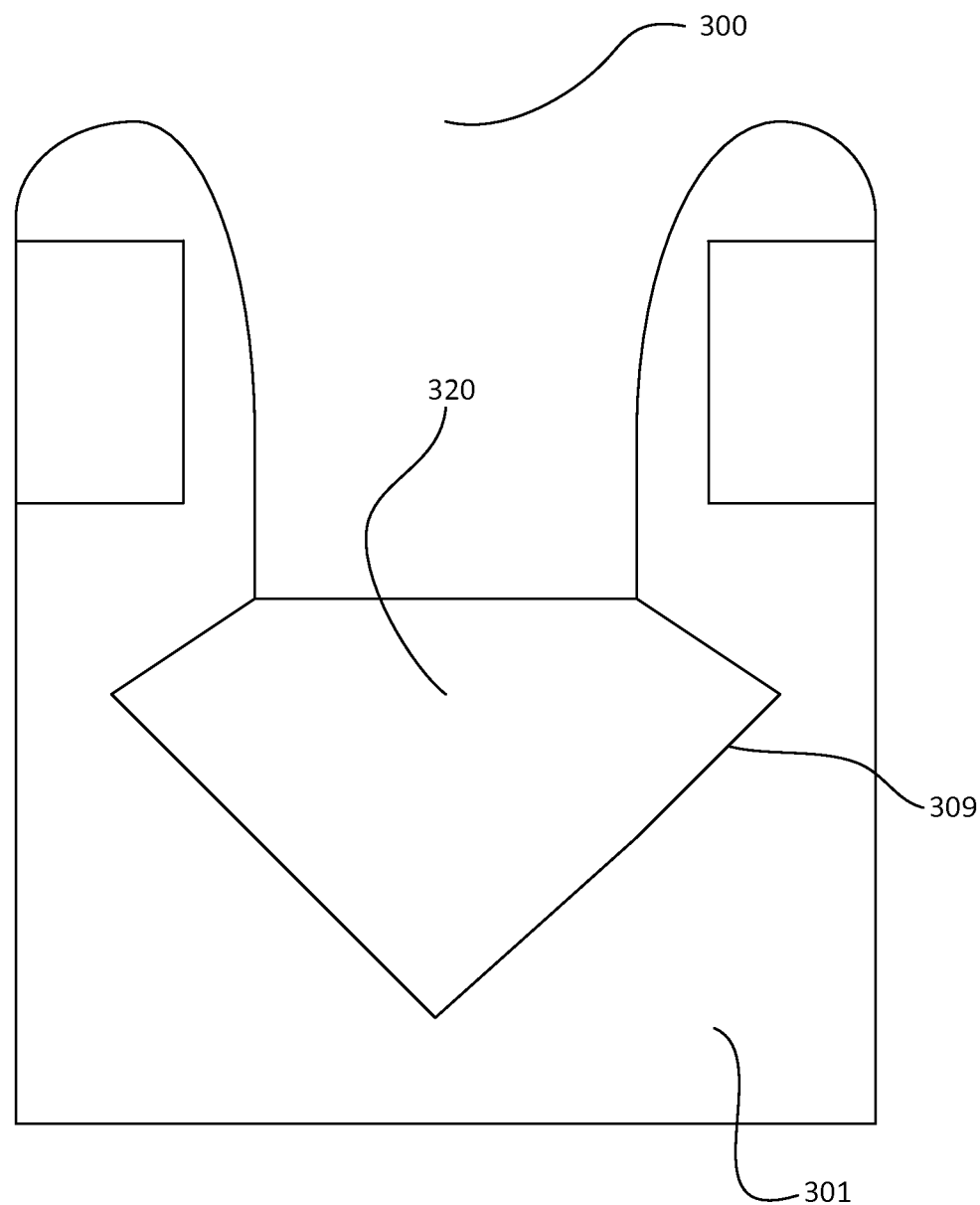
FIG. 3 is a simplified diagram illustrating a cavity structure filled with SiGe material according to an embodiment of the present invention.

FIG. 3 is a simplified diagram illustrating a cavity structure filled with SiGe material according to an embodiment of the present invention. This diagram is merely an example, which should not unduly limit the scope of the claims. One of ordinary skill in the art would recognize many variations, alternatives, and modifications. As shown in FIG. 3, the semiconductor 300 comprises a filling material 320 filled into the shaped cavity. The filling material 320 comprises silicon germanium (SiGe) material. As explained above, SiGe material embedded in the substrate 301 can improve various electrical characteristics, such as carrier mobility. As illustrated in FIG. 1, cavity for embedding SiGe material is U-shaped in various conventional techniques. It is to be appreciated that the shape of the cavity 309 is substantially in a diamond shape that effectively increases the volume of the cavity 309 and the amount of SiGe material that is later to be filled into the cavity 309. More specifically, compared to the U-shaped cavity in FIG. 1, the convex cavity 309 extends from the sidewalls and the bottom surface of the U-shaped cavity, and thus provides a greater volume for the filling material.

FIGS. 4A-D are simplified diagrams illustrating a processing for manufacturing a cavity structure according to an embodiment of the present invention. These diagrams merely provide an example, which should not unduly limit the scope of the claims. One of ordinary skill in the art would recognize many variations, alternatives, and modifications. For example, various steps illustrated in FIGS. 4A-D can be added, removed, replaced, repeated, modified, rearranged, and/or overlapped, and should not unduly limit the scope of claims.

Figure 4A:
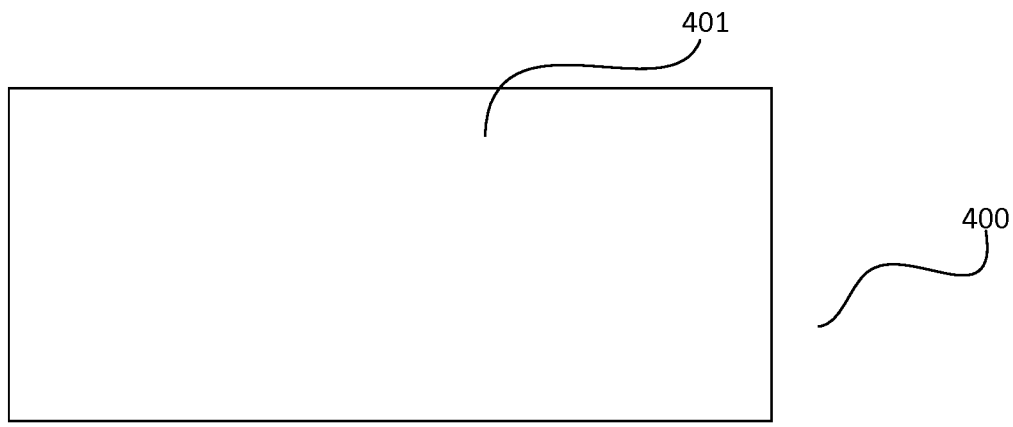
FIGS. 4A-D are simplified diagrams illustrating a process for manufacturing a cavity structure according to an embodiment of the present invention.

As shown in FIG. 4A, a silicon substrate 401 is provided for forming a semiconductor device 400, which is to be formed. For example, the silicon substrate 400 is a part of a semiconductor wafer, on which a large number of substrates with structures (e.g., cavity) similar to that of the substrate 401 are manufactured. In various embodiments, the silicon substrate 400 is subjected to surface treatment, such as polishing, cleaning, and/or others.

Figure 4B:
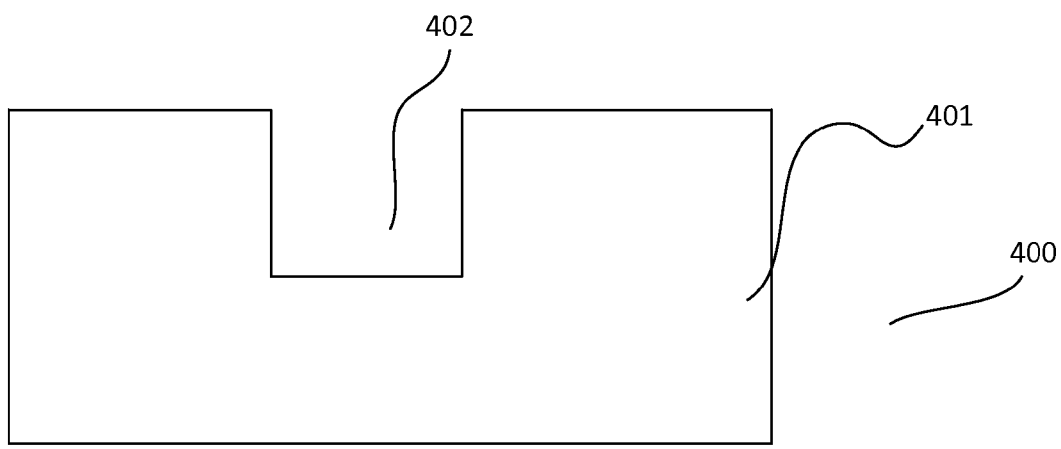

An opening 402 is then formed on the substrate 401, as shown in FIG. 4B. In various embodiments, the opening 402 is formed by an etching process. For example, spacers (not shown in FIG. 4B) are formed around the opening 402 to define the opening, and an etching process is performed. Spacers can be formed using silicon and nitrogen material (e.g., SiN). The chemical composition of the spacers is specifically selected to be different from that of the substrate 401, which allows the spacer material to remain intact while the substrate material is removed during the etching process to form the opening 402.

In various embodiments, the sizes and distances of the spacers are predetermined according to the devices and the cavity to be formed. For example, spacers are characterized by a width of about 10 nm to 20 nm, which defines the distance between the two trenches that are to be formed. In an embodiment, the distance between spacers is about 40 nm to 50 nm, which defines the width of the trenches.

The opening 402 is in substantially a U-shape, which can be used as the cavity for filling in SiGe material. As explained above, U-shaped openings often do not offer sufficient amount of volume for SiGe material. It is thus to be appreciated that according to embodiments of the present invention, an additional etching process is performed to increase the volume of the opening.

Figure 4C:
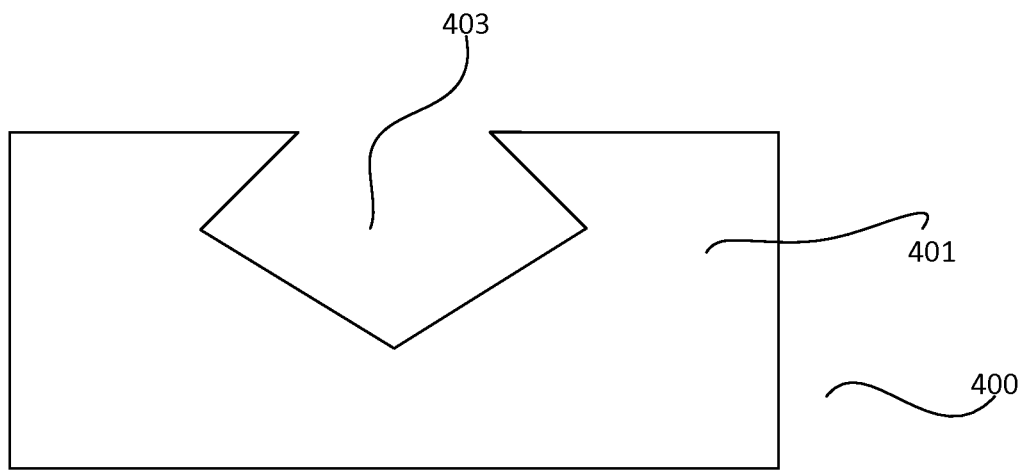

As shown in FIG. 4C, a diamond shaped opening 403 is formed within the substrate 401. For example, a chemical etching process is performed. During the chemical etching process, silicon material of the substrate 401 is etched away from the sidewalls and the bottom of the opening 402. Depending on the specific process used, various types of etchant may be used for forming the opening 402. In a specific implementation, Tetramethylammonium hydroxide ("TMAH") material is used as an etchant to remove silicon material from the substrate 401 and to form the opening 403. It is to be appreciated that other types of materials may be used as well, such as $NH_4OH$. For example, a chemical etchant is deposited within the opening 402 for over 270 seconds to form the diamond shaped opening 403. Depending on the desired opening size and the chemical etchant used, the chemical etching process may take up to over 500 seconds. The chemical etchant etches both vertically and horizontally. The chemical etchant etches vertically downward to remove silicon material from the bottom of the opening 402. The chemical etchant etches horizontally and sideways to remove silicon material from the sidewalls of the opening 402. Since gravity works downward, the etching rate in the vertical direction is greater than the etching rate in the horizontal direction. For example, the etching rate in the vertical direction may be five times greater than the etching rate in the horizontal direction.

During the chemical etching process, silicon substrate material is removed due to chemical reaction between the silicon material and the chemical etchant. As a result, compared to directional etching process, removal of the silicon material is in different directions, and the resulting shape of the opening 403 is related to a lattice angle of about 54.74 degrees, as described above.

Figure 4D:
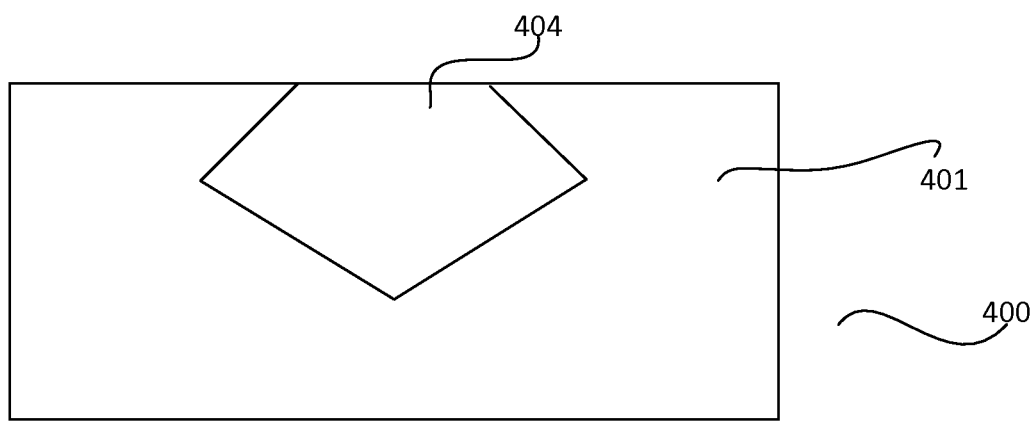

After the diamond shaped opening 403 is formed, SiGe filling material 404 is deposited into the opening 403, as shown in FIG. 4D. For example, the SiGe filling material 404 can be formed by chemical vapor deposition process. In various embodiments, after the diamond shaped cavity 403 is formed, SiGe material 404 is filled into the shaped cavity. Depending on the implementation and the specific needs, the SiGe material 404 may have non-uniform profile. For example, concentration of the germanium material varies within the cavity region, which may result from gradual deposition of the germanium and silicon material. In certain implementations, chemical vapor deposition processes are used for deposition of the SiGe material into the shaped cavity. Semiconductor device 400 additionally may include addition structures. For example, additional structure such as spacers and polysilicon embeddings may be formed over the substrate 401. According to various embodiments, the region filled with SiGe material 430 can be used to form a source region or a drain region of a CMOS device.

It is to be appreciated that the diamond-shaped cavity structures effectively increase the cavity size, and thereby increase the amount of SiGe material that can be filled into the cavity. For example, compared to the Σ-shaped cavity, the diamond shape of a cavity created by the etching process provides an increase in volume of about 20% to 30%. Compared to devices with Σ-shaped cavities, a PMOS device with SiGe material filled into the diamond shaped cavity can provide an improvement in PMOS performance of 3% and even greater.

According to an embodiment, the present invention provides a semiconductor device. The device includes a substrate comprising silicon material. The device also includes a cavity region positioned within the substrate. The cavity region is characterized by a substantially diamond shape. The cavity region includes a first sidewall characterized by an angle of about 54.74 degrees relative to a vertical direction. The device also includes a filling material comprising silicon and germanium material positioned at least partially within the cavity region.

According to another embodiment, the present invention provides a method for fabricating a semiconductor device. The method includes providing a substrate, which consists essentially of silicon material. The method also includes defining a first opening. The method further includes performing a first etching process using a first etchant to form a first opening. The first opening includes substantially vertical sidewalls and a substantially flat bottom surface. The method also includes performing a second etching process using a second etchant to form a second opening. The second opening comprises an angled sidewall and a convex bottom region. The method further includes filling the second opening with silicon and germanium material.

According to yet another embodiment, the present invention provides a method for fabricating a semiconductor device. The method includes providing a substrate. The substrate consists essentially of silicon material. The method also includes forming a plurality of spacers overlaying the substrate. The plurality of spacers includes a first spacer and a second spacer. The method also includes forming a first opening by performing etching between the first spacer and the second spacer. Additionally, the method includes performing a first etching process using a first etchant to form a first opening. The first opening includes substantially vertical sidewalls and a substantially flat bottom surface. The method also includes performing a second etching process using a second etchant to form a second opening. The second opening includes an angled sidewall and a convex bottom region. The method also includes removing the plurality of spacers. The method additionally includes filling the shaped cavity with silicon and germanium material.

It is to be appreciated that the diamond-shaped cavity filled with SiGe material can be formed in-situ, which means that it is only slightly more costly to implement compared to a U-shaped cavity, but provides a meaningful and significant increase in device performance.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A semiconductor device comprising:
   a substrate comprising silicon material;
   a cavity region positioned within the substrate, the cavity region being characterized by a substantially diamond shape, the cavity region comprising a first sidewall characterized by an angle of about 54.74 degrees relative to a vertical direction;
   a filling material comprising silicon and germanium material positioned at least partially within the cavity region; and
   a first spacer and a second spacer within the cavity and surrounding the upper cavity region to ensure an opening size of the cavity region for filing the filling material into the cavity region.

2. The device of claim 1 wherein the filling material is characterized by a graduated concentration profile.

3. The device of claim 1 further comprising a gate, the semiconductor device being a CMOS device.

4. The device of claim 1 further comprising a drain region at least partially overlapping the filling cavity region.

5. The device of claim 1 further comprising a source region at least partially overlapping the filling cavity region.

* * * * *